United States Patent
Liu et al.

(10) Patent No.: US 9,896,584 B2
(45) Date of Patent: Feb. 20, 2018

(54) ARTICLE COATED WITH DLC AND MANUFACTURING METHOD THEREOF

(71) Applicant: SAE Magnetics (H.K.) Ltd., Hong Kong (CN)

(72) Inventors: Qing ping Liu, DongGuan (CN); Zhi hong Hao, DongGuan (CN)

(73) Assignee: SAE MAGNETICS (H.K.) LTD., Hong Kong (CN)

( * ) Notice: Subject to any disclaimer, the term of this patent is extended or adjusted under 35 U.S.C. 154(b) by 57 days.

(21) Appl. No.: 14/721,172

(22) Filed: May 26, 2015

(65) Prior Publication Data

US 2016/0333186 A1 Nov. 17, 2016

(30) Foreign Application Priority Data

May 15, 2015 (CN) .......................... 2015 1 0249445

(51) Int. Cl.
C23C 14/06 (2006.01)
C09D 1/00 (2006.01)
C23C 14/58 (2006.01)

(52) U.S. Cl.
CPC ............ C09D 1/00 (2013.01); C23C 14/0605 (2013.01); C23C 14/5846 (2013.01)

(58) Field of Classification Search
USPC ........ 428/216, 336, 408, 433, 698, 701, 702
See application file for complete search history.

(56) References Cited

U.S. PATENT DOCUMENTS

| | | | |
|---|---|---|---|
| 5,637,353 A | 6/1997 | Kimock et al. | |
| 6,280,834 B1 | 8/2001 | Veerasamy et al. | |
| 6,335,086 B1* | 1/2002 | Veerasamy | B05D 5/083 428/408 |
| 2002/0009593 A1* | 1/2002 | Veerasamy | B05D 5/083 428/408 |
| 2013/0045367 A1* | 2/2013 | Scheibe | C23C 14/0021 428/216 |

FOREIGN PATENT DOCUMENTS

| | | | |
|---|---|---|---|
| CN | 101830089 | * | 9/2010 |
| CN | 102529214 A | | 7/2012 |
| JP | 2005-330556 | * | 12/2005 |

* cited by examiner

Primary Examiner — Archene Turner
(74) Attorney, Agent, or Firm — Nixon & Vanderhye PC

(57) ABSTRACT

A method of making an article coated with DLC, includes providing a substrate; depositing a transition layer on the substrate by means of magnetron sputter deposition (MSD); depositing a DLC layer without hydrogen (H) on the transition layer by means of filtered cathodic vacuum arc (FCVA); and doping a fluorine-doping (F-doping) layer on the DLC layer. The article has good film bonding force, high hardness, good wear resistance, good hydrophobicity and oleophobicity and high light transmittance, and the DLC layer has no H included.

10 Claims, 3 Drawing Sheets

ARTICLE COATED WITH DLC AND MANUFACTURING METHOD THEREOF

This application claims priority to CN 201510249445.8 filed May 15, 2015, the entire contents of which is hereby incorporated by reference.

FIELD OF THE INVENTION

The present invention relates to a field of film material, and more particularly to an article coated with diamond-like carbon (DLC) which is used in touch screens for mobile phones or tablet PCs, and a manufacturing method thereof.

BACKGROUND OF THE INVENTION

Touch screens for electronic devices such as mobile phones or tablet PCs are made of material with low hardness (such as glass), thus which are easily worn and torn by hard material such as small gravels or keys during the daily use, to causes some scratches on the touch screens or even makes the touch screens invalidate. Furthermore, grease and fingerprints on the user's skin are easily remained on the surface of the touch screen, which reduces the visual clarity and the screen effect.

Nowadays, a technique by coating a diamond-like carbon (DLC) film on the touch screen to improve the hardness, scratch and abrasion resistance, and hydrophobicity and oleophobicity has been developed.

For example, U.S. Pat. No. 5,637,353 discloses a method for forming a DLC film on the glass substrate. The DLC film made by Chemical Vapor Deposition (CVD) has a good wear resistance, without a good hydrophobic performance and a high light transmittance due to the thick DLC however. U.S. Pat. No. 6,280,834 discloses a method for forming a DLC film on the glass substrate by Ion Beam Deposition and Chemical Vapor Deposition (IBD-CVD). In this method, $C_2H_2$ is used as the ion source, and the DLC film made by IBD includes a high quantity hydrogen (H) and less tetrahedral amorphous carbon (ta-C) structure with $SP^3$ bond that has high hardness, such that the DLC film has lower hardness with 10~30 GPa, and thus the wear resistance is bad. Chinese publication patent application CN 102529214A discloses a method for making a DLC film on a substrate (such as glass, ceramics, and the like) by CVD. Further, a fluorine (F) layer is doped on the surface of the DLC film so as to obtain good hydrophobicity and oleophobicity. However, the DLC made by this method is doped with H and forms H-C bonds, thus tetrahedral amorphous carbon (ta-C) structures with hard $SP^3$ bond are less, which brings low hardness of 5 GPa around and bad wear resistance therefore. An option to improve the wear resistance is increasing the thickness of the DLC film, which will reduce the light transmittance however.

Thus it's difficult for the conventional DLC films made by the conventional methods to satisfy the requirements of good bonding force among films, high hardness, good wear resistance, good hydrophobicity and high light transmittance. Especially the DLC film is doped with H due to the CVD method, therefore it is difficult to improve the hardness and scratch and abrasion resistance.

Therefore there is a need for an improved article coated with DLC and an improved manufacturing method thereof to overcome the above-mentioned drawbacks.

SUMMARY OF THE INVENTION

One aspect of the present invention is to provide an article coated with DLC, which has good film bonding force, high hardness, good wear resistance, good hydrophobicity and oleophobicity and high light transmittance, and the DLC layer has no H included.

Another aspect of the present invention is to provide a method of making an article coated with DLC, thereby the article has good film bonding force, high hardness, good wear resistance, good hydrophobicity and oleophobicity and high light transmittance, and the DLC layer has no H included.

To achieve above objectives, an article coated with DLC includes a substrate; a transition layer formed on the substrate; a DLC layer without hydrogen (H) formed on the transition layer; and a fluorine-doping (F-doping) layer formed on the DLC layer.

Preferably, the transition layer is selected from the group consisting of silicon (Si), silicon dioxide ($SiO_2$), silicon nitride (SiN), and titanium (Ti), chromium (Cr), copper (Cu) and metal oxide thereof.

As an embodiment of the present invention, the transition layer has a thickness ranging from 5 Å to 20 Å, and the DLC layer has a thickness ranging from 10 Å~30 Å.

Preferably, the substrate is selected from the group consisting of glass, sapphire, ceramic, polymer, metal and metal oxide.

Accordingly, A method of making an article coated with DLC, includes providing a substrate; depositing a transition layer on the substrate by means of magnetron sputter deposition (MSD); depositing a DLC layer without hydrogen (H) on the transition layer by means of filtered cathodic vacuum arc (FCVA); and doping a fluorine-doping (F-doping) layer on the DLC layer.

As an embodiment of the present invention, said coating a DLC layer without H on the transition layer by means of FCVA further comprises: rotating the substrate in a predetermined speed, and applying a bias voltage ranging from −50V to −100V to an anode, during the deposition.

As another embodiment of the present invention, said doping an F-doping layer on the DLC layer comprises doping the F-doping layer by means of radio frequency chemical vapor deposition (RFCVD).

Preferably, said doping the F-doping layer by means of RFCVD comprises: using carbon tetrafluoride ($CF_4$) as doping gas, controlling the CF4 flux ranging from 60 sccm to 100 sccm and controlling the doping time ranging from 10 min to 20 min.

As another embodiment of the present invention, before depositing a transition layer on the substrate by means of MSD further includes cleaning the substrate by means of ion beam etching (IBE).

Preferably, before cleaning the substrate by means of IBE further includes cleaning the substrate by means of ultrasonic waves.

Preferably, the transition layer is selected from the group consisting of silicon (Si), silicon dioxide ($SiO_2$), silicon nitride (SiN), and titanium (Ti), chromium (Cr), copper (Cu) and metal oxide thereof Preferably, the transition layer has a thickness ranging from 5 Å to 20 Å, and the DLC layer has a thickness ranging from 10 Å~30 Å.

Compared with the prior art, the present invention forms the transition layer on the substrate by means of magnetron sputter deposition (MSD), which is deposited uniformly and densely to improve film bonding force; forms the DLC layer without hydrogen (H) on the transition layer by means of filtered cathodic vacuum arc (FCVA), which includes high quantity of $SP^3$ bonds thereby improving the hardness and the scratch and abrasion resistance; and forms the F-doping layer on the DLC layer, which improves the hydrophobicity and oleophobicity. Furthermore, the DLC layer is thin to possess light transmittance over 90%.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
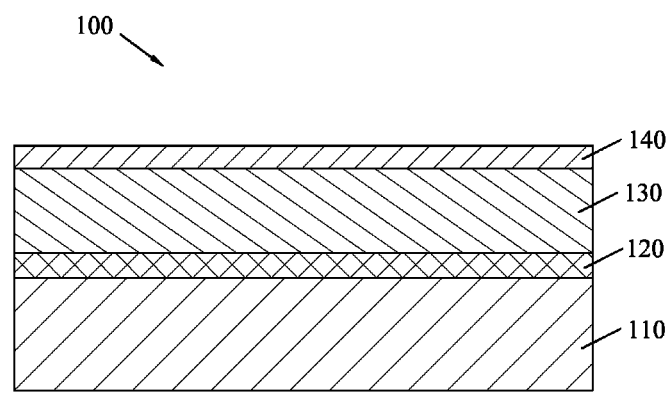
FIG. 1 is a cross-section of an article coated with DLC according to one embodiment of the present invention.

Various preferred embodiments of the invention will now be described with reference to the figures, wherein like reference numerals designate similar parts throughout the various views. As indicated above, the invention is directed to an article with coated DLC and a manufacture method therefore, the DLC layer formed by Filtered Cathodic Vacuum Arc (FCVA) has good film bonding force, high hardness, good wear resistance, good hydrophobicity and oleophobicity and high light transmittance.

As shown in FIG. 1, the article with coated DLC 100 according to one embodiment of the present invention includes a substrate 110, a transition layer 120 formed on the substrate 110, a DLC layer 130 without hydrogen (H) formed on the transition layer 120, and a fluorine-doping (F-doping) layer 140 formed on the DLC layer 130.

Methods of making the article with coated DLC 100 according to the present invention will be described in detailed by combination with FIGS. 2 and 3.

Figure 2:
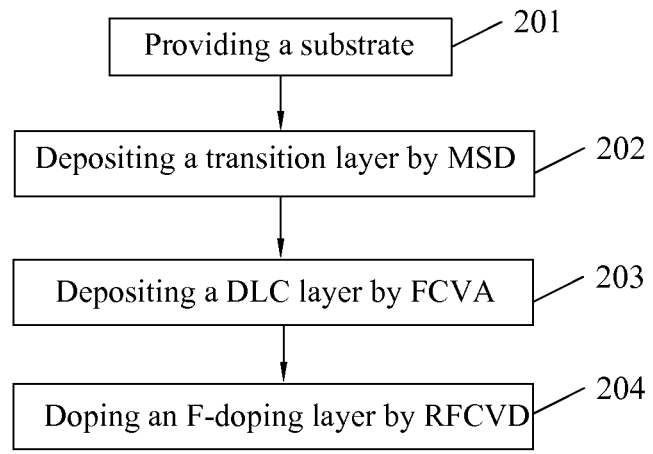
FIG. 2 is a flowchart of a method of making an article coated with DLC according to one embodiment of the present invention.

As shown in FIG. 2, the method of making the article with coated DLC 100 according to one embodiment include the following steps:

201, providing a substrate. Specifically, the substrate can be touch screens material such as glass, tempered glass, sapphire, ceramic, polymer, metal and metal oxide, and the like.

202, depositing a transition layer on the substrate by means of magnetron sputter deposition (MSD). Specifically, 203, depositing a DLC layer without hydrogen (H) on the transition layer by means of filtered cathodic vacuum arc (FCVA); and 204, doping a fluorine-doping (F-doping) layer on the DLC layer by means of Radio Frequency Chemical Vapor Deposition (RFCVD).

The present invention forms the transition layer on the substrate by means of MSD, which is deposited uniformly and densely to improve film bonding force; forms the DLC layer without H on the transition layer by means of FCVA, which includes high quantity of $SP^3$ bonds thereby improving the hardness and wear resistance; and forms the F-doping layer on the DLC layer, which improves the hydrophobicity and oleophobicity. Furthermore, the DLC layer is thin to possess light transmittance over 90%.

Figure 3:
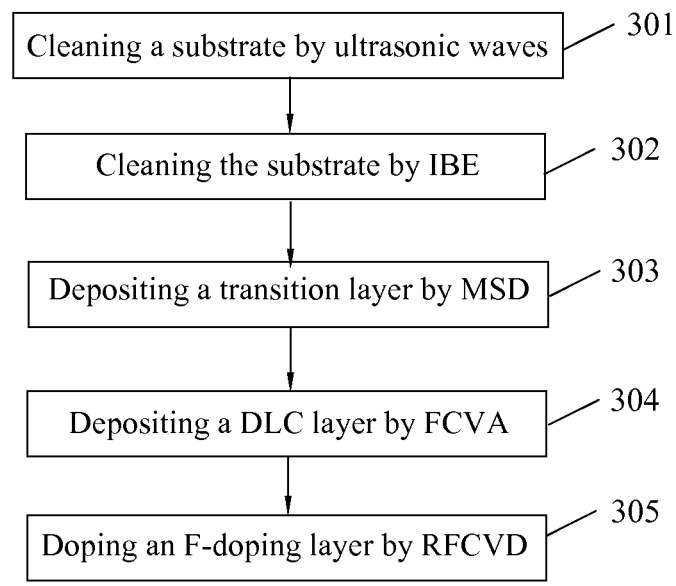
FIG. 3 is a flowchart of a method of making an article coated with DLC according to another embodiment of the present invention.

FIG. 3 shows a simplified method of making the article with coated DLC 100 according to another embodiment. As illustrated, the method includes the following steps:

301, pre-cleaning a substrate. In this step, ultrasonic waves are applied to clean the substrate, and N-methylpyrrolidone (NMP) and Isopropanol (IPA) are taken as the cleaning solution, with a cleaning time is about 30 min. after the ultrasonic wave cleaning, the substrate is put into a sealed box to dry naturally, with the drying time is 1 h, for example. Optionally, the substrate can be touch screens material such as glass, tempered glass, sapphire, ceramic, polymer, metal and metal oxide, and the like.

302, cleaning the substrate. In this step, the substrate is cleaned by means of Ion Beam Etching (IBE) so as to make the substrate surface cleaner to benefit the succedent deposition process. Specifically, the substrate surface is etched by the plasma generated under argon atmosphere so as to be cleaned. Preferably, the incidence angle of the argon (Ar) ion beam is 30°, the rotational speed of the substrate is 20 r/s, and the etching rate is 0.7 Å/s.

303, depositing a transition layer by MSD. In this step, the transition layer is selected from the group consisting of silicon (Si), silicon dioxide ($SiO_2$), silicon nitride (SiN), and titanium (Ti), chromium (Cr), copper (Cu) and metal oxide thereof In this embodiment, the transition layer made by Si is taken as an example. Specifically, Si with high purity is served as the target, and the thickness of the transition layer is 5 Å~20 Å, for example 10 Å. Firstly, the Si target is sputtered for 100 s to make the Si ion beam stable, and the deposition rate of Si is 0.4 Å/s preferably. The Si transition layer formed in this step is covered on the substrate evenly and densely thereby enhancing the bonding force between the substrate and the succedent DLC layer.

304, depositing a DLC layer by FCVA. In this step, the DLC layer is deposited by means of FCVA, and the target is carbon with high purity. The uniform and dense DLC layer could be made by rotating the substrate during the deposition. Preferably, for obtaining more $SP^3$ bonds to improve the hardness of the DLC layer, a bias voltage ranging from −50V to −100V is applied to the anode. Since the DLC layer is formed by FCVA in the invention, and large particles and impurity ions are filtered out by using a magnetic field applied, thus the uniform and dense DLC layer can be obtained. In comparison with the conventional CVD or PVD method to form the DLC layer, the DLC layer formed by the present invention has no H included, and no H-C bond is formed, thus tetrahedral amorphous carbon (ta-C) structures with hard $SP^3$ bond are increased, to 70% above, thereby obtaining high hardness and good scratch and abrasion resistance.

In addition, the thickness of the Si transition layer and the DLC layer is adjustable to control the light transmittance and reflectivity, so as to meet the optical requirements of different touch screens. In this embodiment, the thickness of the DLC layer is smaller than 30 Å, such as 10 Å~30 Å. For the touch screens, it's required that the light transmittance of the DLC layer reaching to the substrate is 90% above.

305, forming an F-doping layer by RFCVD. For improving the hydrophobic and oleophobic properties of the DLC layer, an F-doping layer is formed to cover the DLC layer surface by means of RFCVD. Specifically, the doping gas is $CF_4$, and the $CF_4$ flux is in a range from 60 sccm to 100 sccm, such as 60 sccm, and the doping time is in a range from 10 min to 20 min, such as 15 min. In this embodiment, the thickness of the F-doping layer is in a range of 5 Å~15 Å, and the Fluorine content is 10% by atomic ratio for example. Due to the F irons are formed on the surface of the DLC layer, thus C-F bonds which have good hydrophobic and oleophobic properties are formed on the surface of the DLC layer.

Figure 4:
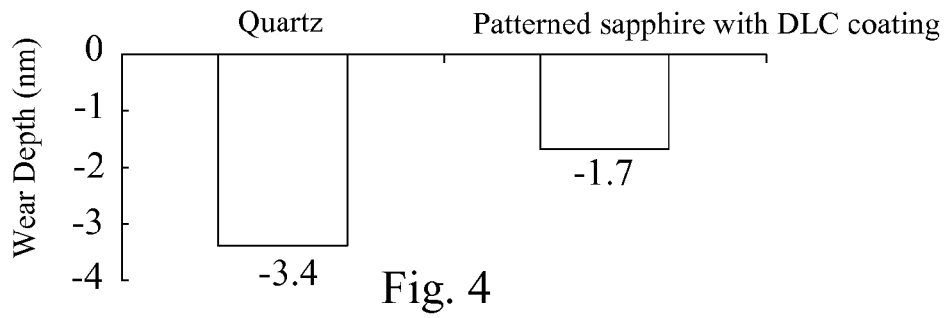
FIG. 4 shows comparison testing data for wear resistance of the article coated with DLC of the present invention and the conventional one.
Figure 5:
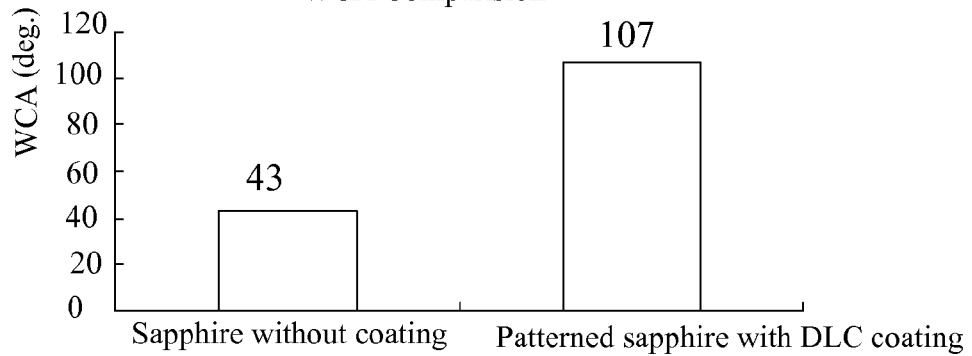
FIG. 5 shows comparison testing data for water contact angle of the article coated with DLC of the present invention and the conventional one.
Figure 6:
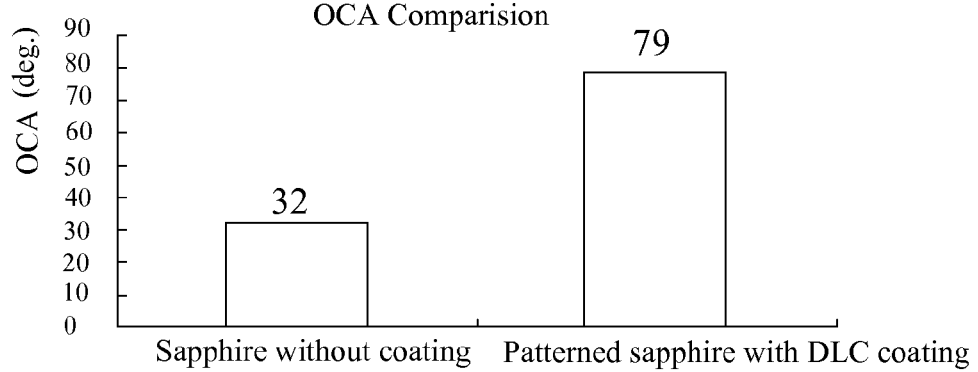
FIG. 6 shows comparison testing data for oil contact angle of the article coated with DLC of the present invention and the conventional one.

FIGS. 4-6 respectively show comparison testing data for wear resistance, water contact angle and oil contact angle of the article coated with DLC of the present invention and the conventional one. In this embodiment, the substrate is patterned sapphire, as known, sapphire has a high hardness but a lower reflectivity, which causes insufficient light reflected from the substrate to reach the user eyes. However the reflectivity of the substrate will be increased after the DLC layer is formed, thereby improving the user comfort. The substrate with DLC composite layers has a hardness of 70 GPa above (which is tested by Nano-indention method). FIG. 4 shows that the patterned sapphire substrate with DLC composite layers has an excellent scratch and abrasion resistance than the quartz, FIGS. 5 and 6 show the patterned sapphire substrate with DLC composite layers has larger water contact angle (WCA) and oil contact angle (OCA) to obtain good hydrophobic and oleophobic properties, with the WCA is 107 deg., and the OCA is 79 deg.

In conclusion, The present invention forms the transition layer on the substrate by means of MSD, which is deposited uniformly and densely to improve film bonding force; forms the DLC layer without H on the transition layer by means of FCVA, which includes high quantity of $SP^3$ bonds thereby improving the hardness and wear resistance; and forms the F-doping layer on the DLC layer, which improves the hydrophobicity and oleophobicity. Furthermore, the DLC layer is thin to possess light transmittance over 90%.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. An article coated with diamond-like carbon (DLC), comprising:
   a substrate;
   a transition layer formed on the substrate;
   a DLC layer without hydrogen (H) formed on the transition layer; and
   a fluorine-doping (F-doping) layer formed on the DLC layer.

2. The article coated with DLC according to claim 1, wherein the transition layer comprises silicon (Si), silicon dioxide ($SiO_2$), silicon nitride (SiN), and titanium (Ti), chromium (Cr), copper (Cu) and/or metal oxide.

3. The article coated with DLC according to claim 1, wherein the transition layer has a thickness ranging from 5 Å to 20 Å, and the DLC layer has a thickness ranging from approximately 10 Å to 30 Å.

4. The article coated with DLC according to claim 1, wherein the substrate comprises glass, sapphire, ceramic, polymer, metal and/or metal oxide.

5. The article coated with diamond-like carbon (DLC) according to claim 1, wherein the transition layer is deposited on the substrate by means of magnetron sputter deposition (MSD).

6. The article coated with diamond-like carbon (DLC) according to claim 5, wherein depositing the transition layer on the substrate by means of MSD comprises cleaning the substrate by means of ion beam etching (IBE) or ultrasonic waves.

7. The article coated with diamond-like carbon (DLC) according to claim 1, wherein the DLC layer is deposited on the transition layer by means of filtered cathodic vacuum arc (FCVA).

8. The article coated with diamond-like carbon (DLC) according to claim 1, wherein the DLC layer is deposited on the transition layer by rotating the substrate in a predetermined speed, and applying a bias voltage ranging from −50V to −100V to an anode, during the deposition.

9. The article coated with diamond-like carbon (DLC) according to claim 1, wherein the F-doping layer is doped on the DLC layer by means of radio frequency chemical vapor deposition (RFCVD).

10. The article coated with diamond-like carbon (DLC) according to claim 9, wherein the F-doping layer is doped on the DLC layer using carbon tetrafluoride (CF4) as doping gas, controlling the CF4flux ranging from 60 sccm to 100 sccm and controlling the doping time ranging from 10 min to 20min.

* * * * *